United States Patent
Wolf et al.

(10) Patent No.: US 8,476,935 B2
(45) Date of Patent: Jul. 2, 2013

(54) COMPARATOR WITH SELF-LIMITING POSITIVE FEEDBACK

(75) Inventors: Robert Wolf, Dresden (DE); Christoph Lang, Cupertino, CA (US); Xinyu Xing, San Jose, CA (US); Sam Kavusi, Menlo Park, CA (US)

(73) Assignee: Robert Bosch GmbH, Stuttgart (DE)

( * ) Notice: Subject to any disclaimer, the term of this patent is extended or adjusted under 35 U.S.C. 154(b) by 100 days.

(21) Appl. No.: 12/497,216

(22) Filed: Jul. 2, 2009

(65) Prior Publication Data

US 2011/0001515 A1  Jan. 6, 2011

(51) Int. Cl.
*H03K 5/22* (2006.01)
(52) U.S. Cl.
USPC .............................. 327/66; 327/563; 327/67
(58) Field of Classification Search
USPC ...... 327/63–68, 77, 87, 89, 563; 330/252–253
See application file for complete search history.

(56) References Cited

U.S. PATENT DOCUMENTS

| | | | |
|---|---|---|---|
| 5,386,207 A | 1/1995 | Lin | |
| 5,600,269 A * | 2/1997 | Song et al. | 327/52 |
| 5,661,675 A | 8/1997 | Chin et al. | |
| 6,097,253 A * | 8/2000 | Hissen | 330/277 |
| 6,489,813 B2 * | 12/2002 | Kulhalli et al. | 327/77 |
| 6,977,601 B1 * | 12/2005 | Fletcher et al. | 341/143 |
| 7,339,431 B2 * | 3/2008 | Forbes et al. | 330/253 |
| 7,525,394 B2 * | 4/2009 | Gerber et al. | 331/143 |
| 2002/0030515 A1 | 3/2002 | Garnier | |
| 2004/0119531 A1 * | 6/2004 | Shen et al. | 330/9 |
| 2006/0082416 A1 * | 4/2006 | Marholev | 330/258 |
| 2008/0238513 A1 | 10/2008 | Poenaru et al. | |
| 2008/0309533 A1 * | 12/2008 | Baker | 341/143 |

FOREIGN PATENT DOCUMENTS

WO  02084862  10/2002

OTHER PUBLICATIONS

Sepke et al., Comparator-Based Switched-Capacitor Circuits for Sealed CMOS Technologies, 2006 IEEE International Solid-State Circuits Conference, Digest of Technical Papers, 2006, pp. 220-221 (2 pages).
ISSCC 2006 Paper Continuations, Figure 12.4.7: CBSC ADC chip micrograph, 2006 IEEE International Solid-State Circuits Conference, p. 649 (1 page).
International Search Report in related International Application (i.e., PCT/US2010/040642), dated Sep. 14, 2010 (4 pages).

* cited by examiner

*Primary Examiner* — Quan Tra
(74) *Attorney, Agent, or Firm* — Maginot, Moore & Beck

(57) ABSTRACT

A method and circuit for attenuating positive feedback in a comparator in one embodiment includes an amplifier configured to compare a first input signal with a second input signal and to provide an output based upon the comparison, a non-linear function with a first input operably connected to an output of the amplifier, and a feedback loop operably connected to the output of the non-linear function and to a second input of the non-linear function, the feedback loop including a feedback limiting circuit configured to attenuate a feedback signal to the second input of the non-linear function.

14 Claims, 4 Drawing Sheets

COMPARATOR WITH SELF-LIMITING POSITIVE FEEDBACK

FIELD

The present disclosure relates to comparators and more specifically to comparators with positive feedback.

BACKGROUND

Among integrated circuits, comparators are circuit blocks that produce an output signal based upon a comparison between two input voltage levels. The output signal transitions between two values depending on the relative magnitude of the input voltage levels. For instance, a comparator output may be configured to generate a "high" output voltage level when a first input voltage is greater than a second input voltage and a "low" output voltage level when the first input voltage is less than the second input voltage. An exemplary high output voltage level may be five volts and an exemplary low output voltage level may be zero volts. The output voltages selected for a particular application may be higher or lower depending on design choices.

Comparators are useful in a wide variety of circuit applications, including analog to digital ("A/D") converters. Many comparators, however, exhibit slow transitions between the high and low output voltages. The slow response of some comparators is a not suitable in various circuits. Specifically, many modem electronic circuits are designed to exhibit increased speed in comparison with traditional circuits. A slowly responding comparator in such a circuit slows the device to an unacceptable speed. To keep pace with the need for increased speed, some comparators are designed to exhibit a more rapid transition between the "low" and "high" output voltage levels. High-gain amplifiers, for example, are semiconductor devices capable of transiting between voltage levels very quickly. Accordingly, amplifiers may be incorporated as a comparator in a circuit to increase the speed of the circuit.

The transition speed of an amplifier may be increased by the inclusion of a feedback loop as is known in the art. By way of example, FIG. 1 depicts a circuit 10 which includes an amplifier 12 which provides an input to a non-linear function 14. The non-linear function 14 applies positive feedback from a non-linear function 16 to the output of the amplifier 12.

Application of positive feedback by the non-linear function 14 is controlled by a logic circuit 18 which senses the output of the non-linear function 16 and, when a transition in output voltage is sensed, closes a switch 20 thereby applying the output of the non-linear function 16 to an input of the non-linear function 14. Once the output value of the non-linear function 16 is no longer changing, the control logic circuit 18 controls the switch 20 to an open position.

The increased transition speed of an amplifier comparator with positive feedback compared to an amplifier comparator without positive feedback is evidenced by the chart 30 in FIG. 2 which includes an input portion 32, an output portion 34, and a power portion 36. In the chart 30, solid lines in the output and power portions of the chart 30 correspond to the comparator 10 with positive feedback and the dashed lines in the output and power portions of the chart 30 correspond to the comparator without positive feedback.

Chart 30 depicts two input signals 38 and 40 which are applied to the two comparators. From T=0 to T=1, the input signal 38 is higher than the input signal 40. In this example, both comparators are configured to exhibit a low output signal when the input signal 38 is higher than the input signal 40. This is reflected in the output value lines 42 and 44 in the output portion 34.

At T=1, however, the value of the input signal 40 exceeds the value of the input signal 38. Accordingly, the outputs 42 and 44 begin to transition to a high value. The transition from a low output to a high output requires expenditure of power. Accordingly, the power expenditure of the comparators, indicated by the power consumption lines 50 and 52, begins to increase.

The logic circuit 18 detects the increase in the output of the non-linear function 16 and closes the switch 20 at T=2. Accordingly, the power consumed by the comparator 10 (line 50) exhibits a rapid increase followed at time T=3 by a rapid increase in the output level of the non-linear function 16 as feedback is provided by the non-linear function 14. At time T=4, the output of the non-linear function 16 is at the "high" output level. This is sensed by the logic circuit 18 at time T=4, and shortly thereafter the switch 20 is opened, resulting in a sudden drop in the consumed power (line 50).

As evidenced by a comparison of the output line 42 with the output line 44, the comparator 10 with positive feedback achieves the final high value more quickly than the comparator without positive feedback. As evidenced by a comparison of the power consumption line 50 with the power consumption line 52, the comparator 10 with positive feedback achieves the final high value at the expense of a power spike. The power spike extends beyond the time that the final output value is achieved because the control logic 18 is unable to open the switch 20 at the exact moment the output reaches its final value. Thus, the delay introduced by the control logic 18 generates a plateau of very high power consumption.

A need exists for a comparator that rapidly transitions from one output state to another output state. A rapidly transitioning comparator with low power consumption is also needed.

SUMMARY

A method and circuit for attenuating positive feedback in a comparator in one embodiment includes an amplifier configured to compare a first input signal with a second input signal and to provide an output based upon the comparison, a non-linear function with a first input operably connected to an output of the amplifier, and a feedback loop operably connected to the output of the non-linear function and to a second input of the non-linear function, the feedback loop including a feedback limiting circuit configured to attenuate a feedback signal to the second input of the non-linear function.

In another embodiment, a method of controlling feedback in a comparator includes establishing a first output condition at an output terminal of a comparator circuit, determining that a first input signal to the comparator circuit has a value greater than the value of a second input signal to the comparator circuit, applying a positive feedback signal in the comparator in response to the determination, attenuating the positive feedback signal, and achieving a second output condition at the output terminal of the comparator circuit using the attenuated positive feedback signal.

In yet another embodiment, a comparator circuit includes an output, a positive feedback circuit including a MOSFET with a gate operably connected to the output, and a capacitor in direct electrical communication with the MOSFET.

DETAILED DESCRIPTION

Figure 1:
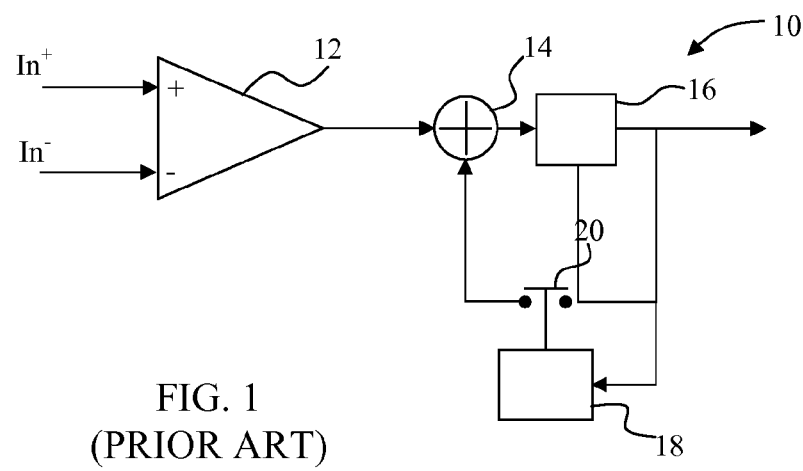
FIG. 1 illustrates, in block diagram form, a prior art high-gain amplifier configured as a comparator with a positive feedback loop.
Figure 2:
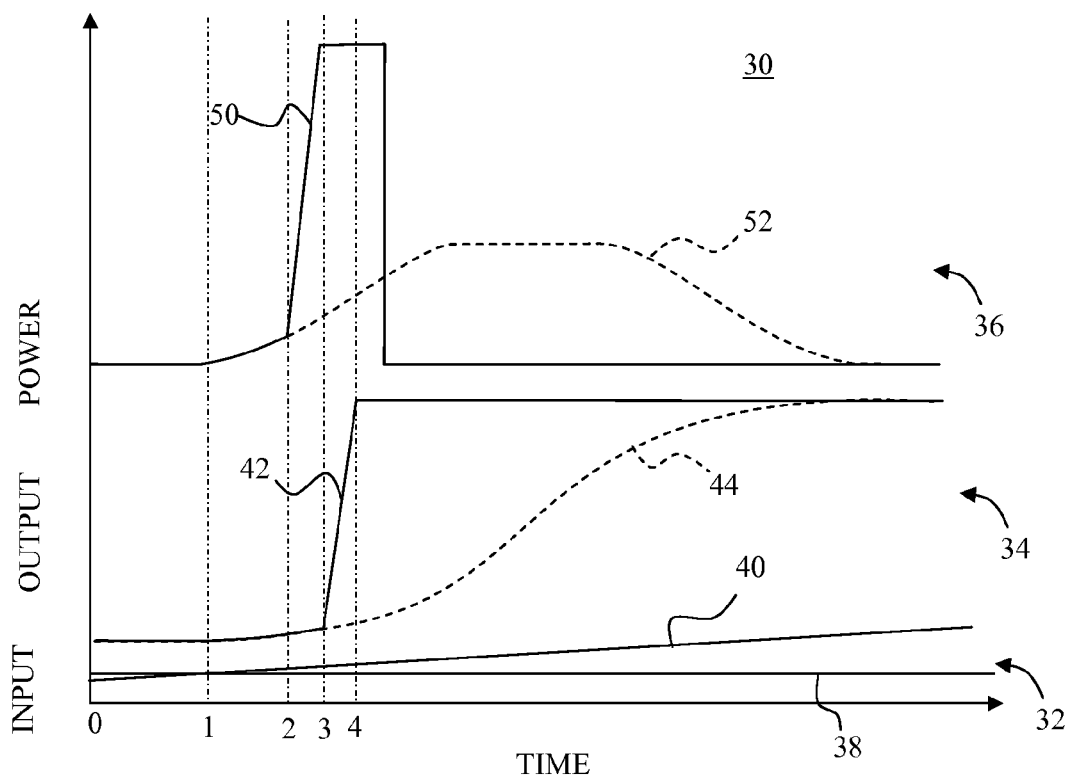
FIG. 2 depicts a graph that demonstrates the relationship between the input signals, the output signal, and the power consumed by a prior art amplifier with a positive feedback loop and a prior art amplifier without a positive feedback loop.
Figure 3:
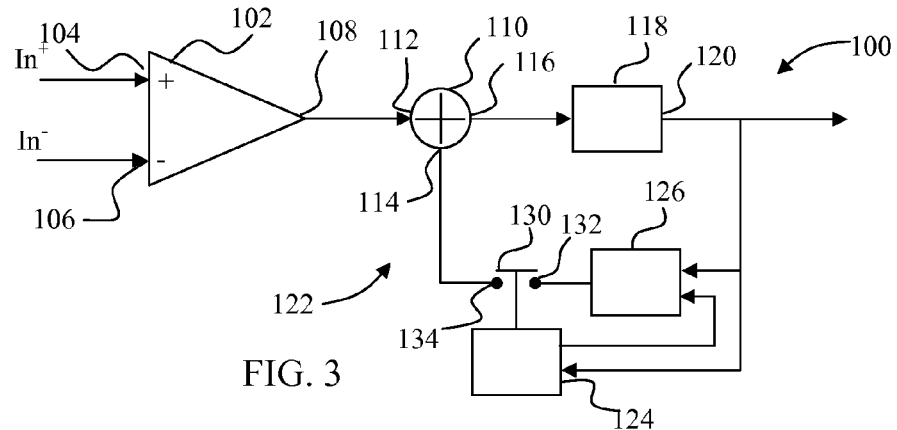
FIG. 3 illustrates, in block diagram form, an amplifier having a positive feedback loop and a feedback limiter device.

With reference to FIG. 3, a circuit 100 includes an amplifier 102 with an input 104 and an input 106. The amplifier 102 includes an output 108 connected to a non-linear function 110 at an input 112. The non-linear function 110 includes a second input 114 and an output 116 which is provided to a non-linear function 118. An output 120 of the non-linear function 118 is connected to a feedback loop 122.

The feedback loop 122 receives input from the output 120 of the non-linear function 118. The input signal is applied to a control logic circuit 124 and a feedback limiting device 126. The control logic circuit 124 controls a switch 130 that includes one terminal 132 connected to the feedback limiting device 126 and another terminal 134 connected to the terminal 114 of the non-linear function 110. The control logic circuit 124 is also connected to the feedback limiting device 126.

Figure 4:
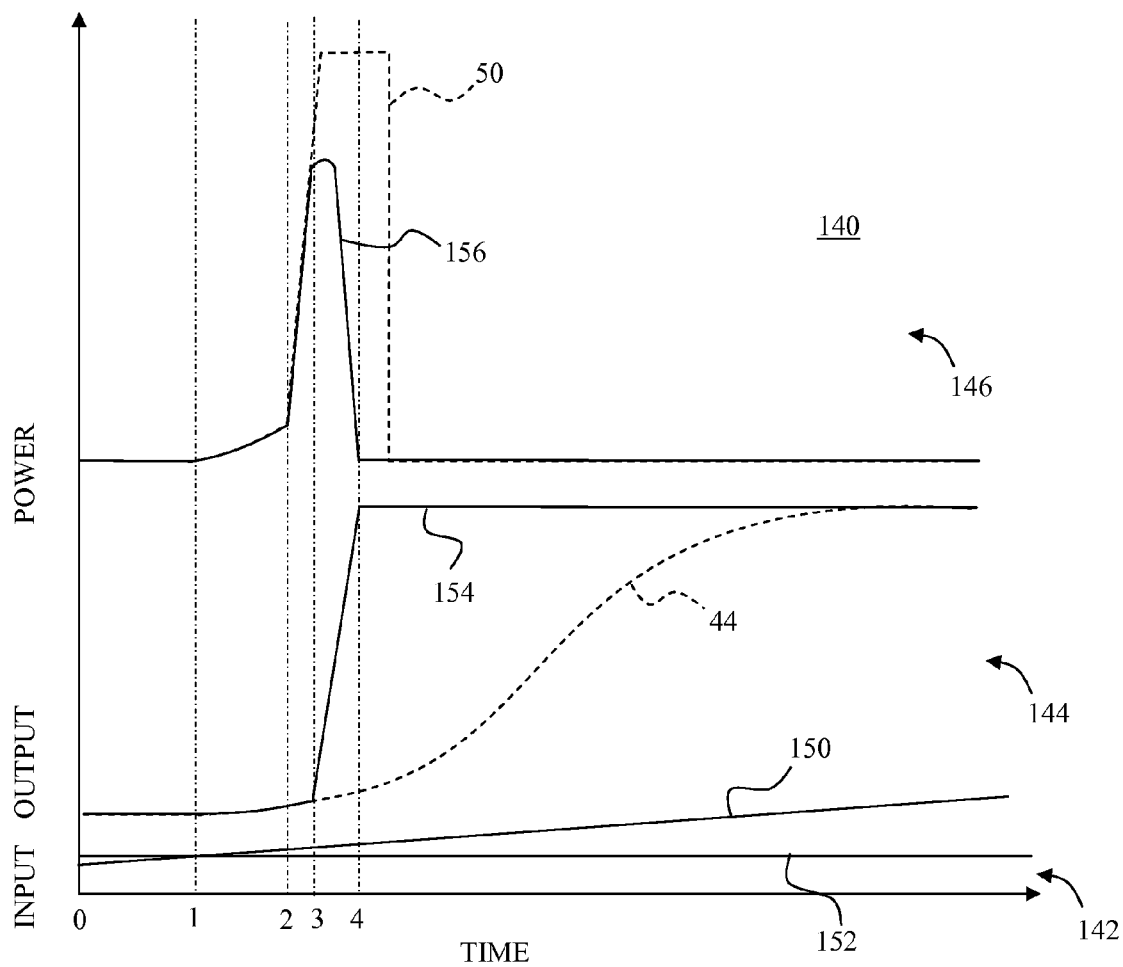
FIG. 4 depicts a graph that demonstrates the relationship between the input signals, the output signal, and the power consumed by the amplifier of FIG. 3.

Operation of the circuit 100 is described with reference to FIG. 4. In FIG. 4, a graph 140 includes an input portion 142, an output portion 144, and a power portion 146. Initially, exemplary input signals 150 and 152 are applied to the inputs 104 and 106, respectively. At time T=0, the voltage 152 has a larger value than the voltage 150. In this embodiment, the amplifier 102 is configured to amplify the difference between signals on the input 104 and 106. The low signal is felt at the input 112 of the non-linear function 110. Because the switch 130 is open, there is no signal at the input 114. Accordingly, the output of the non-linear function 110 is low.

Since the output 116 of the non-linear function 110 is low, the signal provided to the non-linear function 118 is low and a low output signal is maintained at the output 120. The control logic circuit 124 senses a stable low signal at the output 120, and maintains the switch 130 in the open position.

At time T=1, the voltage 150 at the input 104 exceeds the voltage 152 at the input 106. Accordingly, the voltage at the output 108 begins to increase. The increase in voltage at the output 108 is provided as an input to the input 112 of the non-linear function 110. Accordingly, the output 116 of the non-linear function 110 begins to increase.

The increase of the output 116 of the non-linear function 110 is provided to the non-linear function 118 and the output 120 of the non-linear function 118 begins to increase as indicated by the output line 154 immediately after time T=1. The increase is accomplished by an increase in power consumption as indicated by the power consumption line 156 in the power portion 146 after time T=1.

The increased voltage at the output 120 is detected by the logic circuit 124 and the switch 130 is closed at time T=2. Closing of the switch 130 causes a sharp increase in the power consumed by the circuit 100 as indicated by the power consumption line 156 in the power portion 146. Shortly after switch 130 closes, a feedback signal from the terminal 134 is felt at the input 114. Accordingly, the non-linear function 110 adds the feedback signal to the input 112 received from the amplifier 102. This causes a rapid increase in the output 116 of the non-linear function 110. The rapid increase of the output 116 of the non-linear function 110 is provided to the non-linear function 118 and the output 120 of the non-linear function 118 begins to increase rapidly as indicated by the output line 154 immediately after time T=3.

Once the switch 130 is closed, the signal passing from the output 120 of the non-linear function 118 to the input 114 of the non-linear function 110 through the switch 130 also begins to be attenuated by the feedback limiting device 126. Attenuation is accelerated as the rapid increase in the output signal (line 154) occurs after time T=3. Accordingly, the positive feedback signal at the input 114 is decreased, and the power consumed by the circuit 100 is rapidly reduced (see line 156 at time T=3$^+$). When the signal at the output 120 is at the high output voltage level, the control circuit 124 opens the switch 130 at time T=4.

Accordingly, as the output of the circuit 100 (line 154) approaches the final output value, by proper selection of the feedback limiting device 126, the power consumed by the circuit 100 (line 156) approaches zero since the feedback signal at the input 114 to the non-linear function 110 becomes significantly attenuated.

The circuit 100 thus provides a significant increase in response time as compared to a comparator circuit incorporating an amplifier with no positive feedback (line 44 of FIG. 4) while consuming significantly less power than the circuit 10 (line 50).

In some circuits, the feedback limiting device 126 may be embodied as an energy storing device. Specifically, in circuits where signal processing is done in the voltage domain, the feedback limiter device 126 may be a capacitor. One such example is the circuit 170 depicted in FIG. 5.

The circuit 170 is a comparator which includes the preamplifier. The circuit 170 includes a current source 172 connected to the source of a P-channel MOSFET 174. The gate of the MOSFET 174 is connected to an input terminal 176. The drain of the MOSFET 174 is connected to the source of an N-channel MOSFET 178. The substrate of the MOSFET 174 is connected to the substrate of a P-channel MOSFET 180.

The source of the MOSFET 180 is connected to the current source 172. The gate of the MOSFET 180 is connected to an input terminal 182. The drain of the MOSFET 180 is connected to the source of an N-channel MOSFET 184. The substrate and drain of the MOSFET 184 are connected to circuit ground. The gate of the MOSFET 184 is connected to the gate of an N-channel MOSFET 186. The substrate and drain of the MOSFET 186 are connected to circuit ground. The source of the MOSFET 186 is connected to an output terminal 188 and to the drain of a P-channel MOSFET 190.

The substrate and source of the MOSFET 190 are connected to a supply voltage (not shown). The gate of the MOSFET 190 is connected to the gate and drain of a P-channel MOSFET 192. The substrate and source of the MOSFET 192 are connected to the supply voltage (not shown). The drain of the MOSFET 192 is connected to the source of an N-channel MOSFET 196. The substrate and drain of the MOSFET 196 are connected to circuit ground. The gate of the MOSFET 196 is connected to the gate of the MOSFET 178. The substrate and drain of MOSFET the 178 are connected to circuit ground.

The circuit 170 also includes a positive feedback loop 200. The positive feedback loop 200 includes an N-channel MOSFET 204, and a feedback limiting circuit 206. The gate of the MOSFET 204 is connected to the source of the MOSFET 186, which is coupled to the output voltage terminal 188. The source of the MOSFET 204 is connected to the source of the MOSFET 196. The substrate of the MOSFET 204 is connected to circuit ground.

Finally, the drain of the MOSFET 204 is connected to the feedback limiting circuit 206 which in this embodiment includes a capacitor 208, a current source 210, and a switch 212. Each of the capacitor 208, the current source 210, and the switch 212 are connected to the drain of the MOSFET 204 and to circuit ground.

Figure 5:
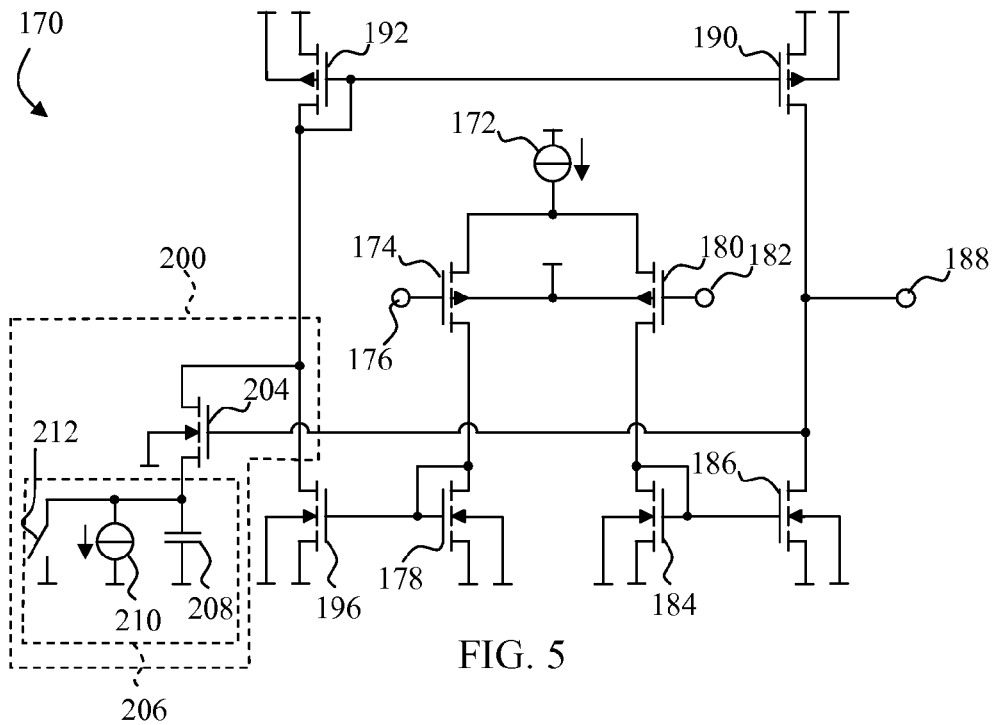
FIG. 5 depicts an exemplary schematic view of a comparator circuit incorporating a feedback limiting device in a positive feedback loop.

The circuit 170 of FIG. 5 generates an output voltage signal on the terminal 188 that transitions between close to the supply voltage ("high") and close to zero volts ("low") depending on the relative magnitude of the input signals applied to terminals 176 and 182. During a transition from low to high voltage, the signal at the output terminal 188 is applied to the gate of the MOSFET 204, allowing current to flow from the source to the drain of the MOSFET 204. The current flowing through the MOSFET 204 represents the positive feedback signal applied to the terminal 114 of FIG. 3 discussed above.

The feedback limiting circuit 206 reduces the magnitude and duration of the positive feedback signal by attenuating the current flowing through the MOSFET 204. Specifically, as the feedback current flows through the MOSFET 204, the current also flows through the capacitor 208. When the capacitor 208 does not contain any stored charge it offers substantially zero impedance to the flow of current. Accordingly, the capacitor 208 initially looks like a short in the feedback circuit 200 allowing maximum feedback current to flow therethrough. This allows the output signal at the terminal 188 to reach the final output value very quickly.

As the feedback current flows through the capacitor 208, the capacitor 208 becomes charged. Once the capacitor 208 beings to store charge, the conductance of MOSFET 204 decreases to a very low level and the feedback current through the feedback circuit 200 is thus reduced, thereby attenuating the positive feedback signal. Additionally, the power consumption rate of the circuit 170 is rapidly reduced.

Once the output terminal 188 is at the desired level, the MOSFET 204 stops passing current from the source to the drain of the MOSFET 204 and current flow through the feedback loop 200 ceases.

Once current is no longer flowing through the feedback loop 200, the current source 210 or the switch 212 is used to drain the charge from the capacitor 208 in preparation for another transition. Since either the current source 210 or the switch 212 can drain the charge from the capacitor 208, in alternative embodiments, only one of the current source 210 or the switch 212 may be incorporated.

Thus, by proper selection of the capacitance of the capacitor 208, the feedback loop 200 may be controlled to reduce the amount of power used by the circuit 170 while providing a rapid transition in the output of the circuit 170.

Figure 6:
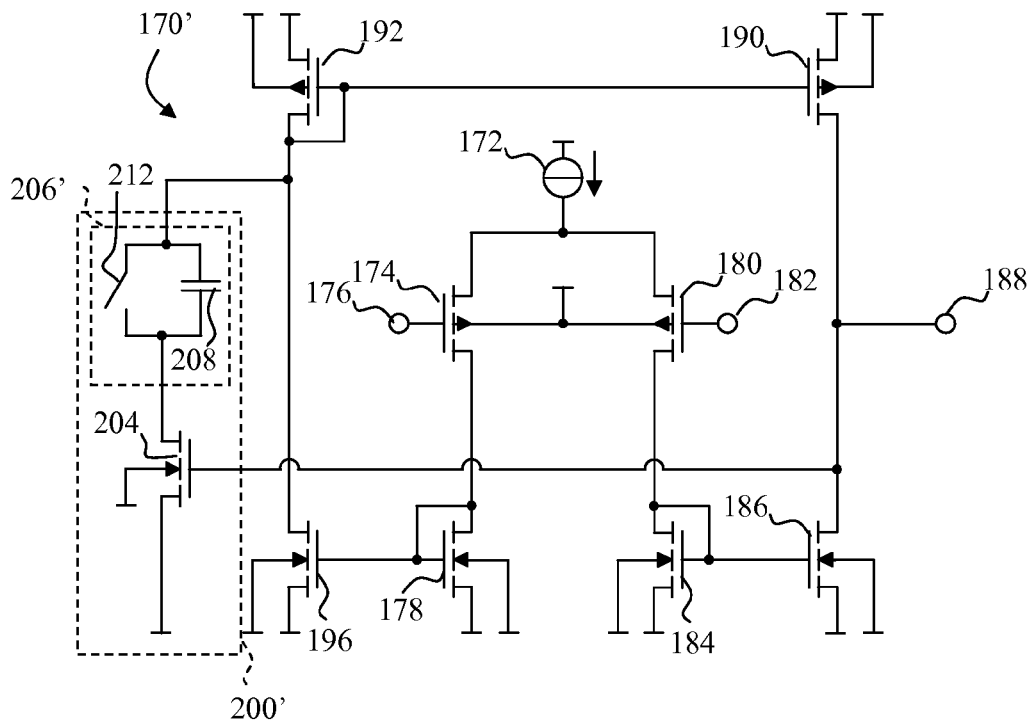
FIG. 6 depicts the comparator circuit of FIG. 5 with the feedback limiting device located at an alternative location within the circuit.

Various circuits may incorporate a feedback limiting device and the feedback limiting device may be located differently in various circuits. By way of example, the circuit 170' of FIG. 6 is similar as the circuit 170 of FIG. 5. In the circuit 170', however, the feedback loop 200' and the feedback limiting circuit 206' are modified from the feedback loop 200 and the feedback limiting circuit 206 of FIG. 5. Specifically, the feedback limiting circuit 206' does not include a current source and the feedback limiting circuit 206' is positioned between the source of the MOSFET 204 and the drain of the MOSFET 192. Operation of the circuit 170', however, is similar to the operation of the circuit 170.

Figure 7:
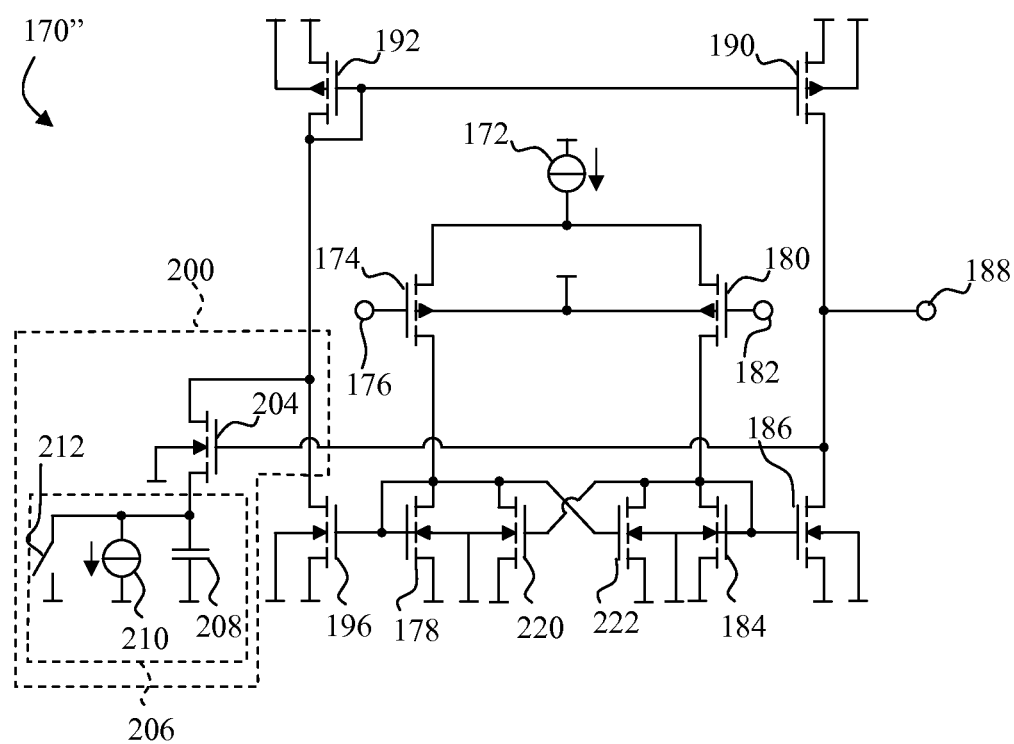
FIG. 7 depicts the comparator circuit of FIG. 5 modified to provide different functionality.

The circuit 170" of FIG. 7 is also substantially the same as the circuit 170 of FIG. 5. In the circuit 170", however, cross-coupled transistors 220 and 222 have been incorporated into the input stage of the circuit 170". Thus, while the functionality of the circuit 170" has been modified for a particular application, the feedback loop 200 continues to be operable for providing positive feedback and the feedback limiting circuit 206 continues to limit the amount of feedback current during a voltage transition in the same manner as described above with respect to the circuit 170.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A comparator circuit comprising:
    an amplifier configured to compare a first input signal with a second input signal and to generate an output signal with reference to the comparison;
    a non-linear function having a single output only, the non-linear function being configured to receive each output signal generated by the amplifier and generate only a single output signal for the comparator circuit at the single output of the non-linear function; and
    a feedback loop having a MOSFET transistor with a gate, a source, and a drain, the gate being operably connected to the single output of the non-linear function and to a second input of the non-linear function, the feedback loop including a feedback limiting circuit having a capacitor connected in series between electrical ground and the drain of the MOSFET transistor, but not connected to the single output of the non-linear function, the capacitor of the feedback limiting circuit being configured to attenuate a feedback signal generated by the MOSFET transistor that is operably connected to the second input of the non-linear function during a transition of the output of the amplifier.

2. The comparator of claim 1, the feedback loop further comprising:
    a current source operably connected in parallel with the capacitor.

3. The comparator of claim 1, the feedback loop further comprising:
    a switch operably connected in parallel with the capacitor.

4. A comparator circuit comprising:
    an amplifier configured to compare a first input signal with a second input signal and to generate an output signal with reference to the comparison;
    a non-linear function having a single output only, the non-linear function being configured to receive each output signal generated by the amplifier and generate only a single output signal for the comparator circuit at the single output of the non-linear function; and
    a feedback loop having a MOSFET transistor with a gate, a source, and a drain, the gate being operably connected to the single output of the non-linear function and to a second input of the non-linear function the feedback loop including a feedback limiting circuit having a capacitor connected in series between the second input to the non-linear function and the source of the MOSFET transistor, but not connected to the single output of the non-linear function, the capacitor of the feedback limiting circuit being configured to attenuate a feedback signal generated by the MOSFET transistor that is operably connected to the second input of the non-linear function during a transition of the output of the amplifier.

5. A method of controlling feedback in a comparator circuit comprising:

establishing a first output condition at an output terminal of a comparator circuit having only one output terminal;

determining that a first input signal to the comparator circuit has a value greater than a value of a second input signal to the comparator circuit;

generating with a transistor operably connected to the only one output terminal of the comparator circuit a positive feedback signal in response to the determination that the first input signal is greater than the second input signal;

attenuating the positive feedback signal during a transition of the output terminal from the first output condition by charging a capacitor that is electrically connected to the transistor and not directly coupled to the output terminal of the comparator circuit, the capacitor being within a positive feedback loop and being charged with a current flowing through the transistor; and achieving a second output condition at the output terminal of the comparator circuit using the attenuated positive feedback signal.

6. The method of claim 5 further comprising:

discharging the capacitor after achieving the second output condition.

7. The method of claim 6, the discharging of the capacitor further comprises:

discharging the capacitor through a switch that is connected across the capacitor in parallel.

8. The method of claim 6, the discharging of the capacitor further comprises:

discharging the capacitor through a current source.

9. The method of claim 5, wherein the transistor is a MOSFET and the charging of the capacitor further comprises:

charging the capacitor with current from the MOSFET to attenuate the positive feedback signal during the transition of the output terminal.

10. The method of claim 5, wherein the transistor is a MOSFET and the attenuation of the positive feedback signal further comprising:

passing current from the capacitor to a source of the MOSFET connected to the capacitor in series within the positive feedback loop.

11. A comparator circuit comprising:

a single output only;

a positive feedback circuit including a MOSFET with a gate operably connected to the single output and one of a source and a drain of the MOSFET operably connected to an input to a non-linear function that generates a signal on the single output; and a capacitor connected in series between electrical ground and the drain of the MOSFET and not in direct electrical communication with the single output, the capacitor configured to attenuate the positive feedback signal provided by the MOSFET of the positive feedback circuit to the non-linear function during a transition of an output signal on the single output.

12. A comparator circuit comprising:

a single output only;

a positive feedback circuit including a MOSFET with a gate operably connected to the single output and one of a source and a drain of the MOSFET operably connected to an input to a non-linear function that generates a signal on the single output; and a capacitor connected in series between the input to the non-linear function and the source of the MOSFET and not in direct electrical communication with the single output, the capacitor configured to attenuate the positive feedback signal provided by the MOSFET of the positive feedback circuit to the non-linear function during a transition of an output signal on the single output.

13. The comparator circuit of claim 11, wherein the positive feedback circuit further comprises:

a switch in parallel with the capacitor, the switch being configured to discharge the capacitor after attenuation of the positive feedback signal is complete.

14. The comparator circuit of claim 11, wherein the positive feedback circuit further comprises:

a current source in parallel with the capacitor, the current source being configured to discharge the capacitor after attenuation of the positive feedback signal is complete.

* * * * *